US011573883B1

(12) United States Patent
Poplack et al.

(10) Patent No.: US 11,573,883 B1
(45) Date of Patent: Feb. 7, 2023

(54) SYSTEMS AND METHODS FOR ENHANCED COMPRESSION OF TRACE DATA IN AN EMULATION SYSTEM

(71) Applicant: CADENCE DESIGN SYSTEMS, INC., San Jose, CA (US)

(72) Inventors: Mitchell G. Poplack, San Jose, CA (US); Aruna Aluri, San Jose, CA (US); Linwei Ding, San Jose, CA (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 789 days.

(21) Appl. No.: 16/219,860

(22) Filed: Dec. 13, 2018

(51) Int. Cl.
*G06F 11/34* (2006.01)
*G06F 30/20* (2020.01)
*G01R 31/3183* (2006.01)
*H03M 7/30* (2006.01)

(52) U.S. Cl.
CPC .. *G06F 11/3461* (2013.01); *G01R 31/318335* (2013.01); *G06F 11/348* (2013.01); *G06F 30/20* (2020.01); *H03M 7/30* (2013.01)

(58) Field of Classification Search
CPC .............................................. G01R 31/318335
See application file for complete search history.

(56) References Cited

U.S. PATENT DOCUMENTS 4,179,704 A * 12/1979 Moore ................. H04N 5/2625 348/579
5,392,420 A * 2/1995 Balmer ................. G06F 1/3203 703/28
5,680,583 A * 10/1997 Kuijsten ................. G06F 30/33 703/23
5,850,565 A * 12/1998 Wightman .......... H03M 7/3084 710/1
5,895,463 A * 4/1999 Dowling ............... G06F 40/242
6,457,144 B1 * 9/2002 Eberhard .............. G06F 11/349 710/32
6,530,054 B2 * 3/2003 Hollander ...... G01R 31/318342 714/739
(Continued)

OTHER PUBLICATIONS

Richard A. Uhlig and Trevor N. Mudge. 1997. Trace-driven memory simulation: a survey. ACM Comput. Surv. 29, 2 (Jun. 1997), 128-170. DOI:https://doi.org/10.1145/254180.254184 (Year: 1997).*
(Continued)

*Primary Examiner* — Akash Saxena
(74) *Attorney, Agent, or Firm* — Foley & Lardner LLP

(57) ABSTRACT

A trace subsystem of an emulation system may generate differential frame data based upon successive frames. If one compression mode, the trace subsystem may set a flag bit and store differential frame data if there is at least one non-zero bit in the differential frame data. If the differential frame data includes only zero bits, the trace subsystem may set the flag bit without storing the frame data. In another compression mode, the computer may further compress the differential data if the frame data includes one (one-hot) or two (two-hot) non-zero bits. The controller may set flag bits to indicate one of all-zeroes, one-hot, two-hot, and random data conditions (more than two non-zero bits). For one-hot or two-hot conditions, the controller may store bits indicating the positions of the non-zero bits. For random data conditions, the controller may store the entire differential frame.

20 Claims, 15 Drawing Sheets

370 372 374 376

| Input Data Bytes | Flag(2bits) | Output Data | Total bits |
|---|---|---|---|
| 0x0000 | 00 | None | 2 |
| One Hot | 01 | 4 bit index of 1's bit | 2+4 |
| Two Hot | 10 | {4 bit index of MSB 1's bit, 4 bit index of LSB 1's bit} | 2+8 |
| Random data | 11 | 2 bytes | 2+16 |

500

(56) References Cited

U.S. PATENT DOCUMENTS

| | | | | |
|---|---|---|---|---|
| 6,629,297 | B2 * | 9/2003 | Ganesan | G06F 30/33 716/106 |
| 7,069,544 | B1 * | 6/2006 | Thekkath | G06F 11/364 714/E11.207 |
| 8,533,685 | B2 * | 9/2013 | Horley | G06F 11/348 714/45 |
| 8,739,090 | B1 * | 5/2014 | Gao | G06F 30/331 716/136 |
| 8,887,018 | B2 * | 11/2014 | Narayanan | G01R 31/318536 714/729 |
| 9,292,640 | B1 * | 3/2016 | Elmufdi | G06F 30/331 |
| 9,372,947 | B1 * | 6/2016 | Elmufdi | G06F 30/331 |
| 10,073,795 | B1 * | 9/2018 | Poplack | G06F 13/1642 |
| 11,042,500 | B1 * | 6/2021 | Guo | G06F 9/30101 |
| 11,176,018 | B1 * | 11/2021 | Aluri | G06F 11/348 |
| 2001/0054175 | A1 * | 12/2001 | Watanabe | G06F 11/3636 717/128 |
| 2002/0055828 | A1 * | 5/2002 | Swoboda | G06F 11/364 703/13 |
| 2002/0162055 | A1 * | 10/2002 | Kurooka | H04B 1/74 714/45 |
| 2002/0177969 | A1 * | 11/2002 | Labrie | G01R 31/31928 702/125 |
| 2002/0177990 | A1 * | 11/2002 | Sample | G01R 31/3185 703/28 |
| 2004/0073838 | A1 * | 4/2004 | Tabe | G06F 11/3636 714/29 |
| 2004/0249623 | A1 * | 12/2004 | Selvidge | G06F 30/331 703/23 |
| 2004/0255595 | A1 * | 12/2004 | Morgan | F02C 9/28 60/773 |
| 2006/0047461 | A1 * | 3/2006 | Sivaram | H04L 43/50 702/120 |
| 2007/0101215 | A1 * | 5/2007 | Holmqvist | G01R 31/2834 714/724 |
| 2010/0318344 | A1 * | 12/2010 | Poplack | G06F 30/33 703/23 |
| 2014/0214389 | A1 * | 7/2014 | Washio | G16B 5/00 703/11 |
| 2019/0220403 | A1 * | 7/2019 | Mola | G06F 11/362 |
| 2020/0184029 | A1 * | 6/2020 | Sakai | G06F 30/20 |

OTHER PUBLICATIONS

Hankerson et al. Introduction to Information Theory and Data Compression, CRC Press LLC, 1998, pp. v-xi, 57-93,99-111 (Year: 1998).*

* cited by examiner

100

200

334

| | | | | | | | | d | d | d | d | d | d |
|---|---|---|---|---|---|---|---|---|---|---|---|---|---|
| | | | | | | | 0 | 0 | 1 | 1 | 1 | 1 | 1 | 1 |

Accumulated data bits
Valid indicator bits

336

| . | . | . | . | D | D | D | D | D | D | d | d | d | d | d | d |
|---|---|---|---|---|---|---|---|---|---|---|---|---|---|---|---|
| 0 | 0 | 0 | 0 | 1 | 1 | 1 | 1 | 1 | 1 | 1 | 1 | 1 | 1 | 1 | 1 |

Accumulated data bits
Valid indicator bits

338

| . | . | . | . | D | D | D | D | . | . | . | . | . | . | . | . |
|---|---|---|---|---|---|---|---|---|---|---|---|---|---|---|---|
| 0 | 0 | 0 | 0 | 1 | 1 | 1 | 1 | 0 | 0 | 0 | 0 | 0 | 0 | 0 | 0 |

Accumulated data bits
Valid indicator bits 356 358 360 362

| Input Data Byte | Flag | Output Data Byte | Total bits |
| --- | --- | --- | --- |
| 0x00 | 1 | None | 1 |
| Byte(anything other than 0x00) | 0 | Byte | 1+8 |

FIG. 3H 370 372 374 376

| Input Data Bytes | Flag(2bits) | Output Data | Total bits |
|---|---|---|---|
| 0x0000 | 00 | None | 2 |
| One Hot | 01 | 4 bit index of 1's bit | 2+4 |
| Two Hot | 10 | {4 bit index of MSB 1's bit,<br>4 bit index of LSB 1's bit) | 2+8 |
| Random data | 11 | 2 bytes | 2+16 |

Input 386

| | | | | | | | |
|---|---|---|---|---|---|---|---|
| **5** | **-** | **4** | **3** | **2** | **1** | **-** | **0** |
| - | - | - | - | 8 | 7 | 6 | - |
| C | - | B | A | - | 9 | - | - |
| **4** | 3 | 2 | 1 | 0 | F | E | D |
| - | - | 7 | 6 | 5 | - | - | - |
| - | - | - | - | - | - | - | - |

Output 388

| | | | | | | | |
|---|---|---|---|---|---|---|---|
| **7** | **6** | **5** | **4** | **3** | **2** | **1** | **0** |
| **F** | D | E | C | B | A | 9 | 8 |
| **7** | 6 | 5 | 4 | 3 | 2 | 1 | 0 |

Input 392

| 512 bits Word0 | 512 bits Word1 | 512 bits Word2 | 512 bits Word3 | 512 bits Word4 | 512 bits Word5 | 512 bits Word6 | 512 bits Word7 |

Output 394
512 bits

| 64 bits Word0 | 64 bits Word1 | 64 bits Word2 | 64 bits Word3 | 64 bits Word4 | 64 bits Word5 | 64 bits Word6 | 64 bits Word7 |

500

SYSTEMS AND METHODS FOR ENHANCED COMPRESSION OF TRACE DATA IN AN EMULATION SYSTEM

TECHNICAL FIELD

This application is generally directed towards an emulation system, and more specifically towards compressing trace data in the emulation system.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs.

A significant function of EDA tools is emulation of a user logical system (e.g., an IC design) to perform pre-silicon functional verification, firmware and software development, and post-silicon debug. To achieve this, a typical processor-based emulation system includes several Application Specific Integrated Circuits (ASICs) all working together to execute a program generated by an emulation compiler generated from the user's IC design. The compiled program models a design under test (DUT) that is a logical representation of the user's IC design running on the emulation system.

During emulation of the IC design, trace data of states of the various IC design elements mapped onto the IC design is obtained and stored. A double data rate (DDR) memory stores the trace data record of changing states of signal inputs, signal outputs, and internal signals of the IC design being emulated. Typically, the changing states of the signal inputs, the signal outputs, and the internal signals of the IC design being emulated are stored once per an emulation clock cycle in the DDR memory. The trace data stored in the DDR memory is then made available to the circuit designer, which is often used to debug the IC design. For instance, the trace data allows the circuit designer to emulate the IC design up to a point where an error condition occurs. The DDR memory may continue to collect signal states but at some point tracing is stopped to allow the circuit designer to examine the record of signal states to determine what events caused the error.

Currently, emulation processors transmit the trace data into the DDR memory, and the amount of the trace data that can be stored into the DDR memory is limited based on the size of the DDR memory. As the number of the IC design elements mapped into the IC design increases, the amount of trace data increases as well, but there may not be enough capacity in the DDR memory to store all the trace data due to the limited bandwidth of the DDR memory. As such, the size of the DDR memory limits the amount of trace data that may be stored into the DDR memory, and therefore, there becomes the problem of how to store and/or transfer all of the trace data into and out of the DDR memory. Furthermore, as the emulation system gets faster, more trace data is generated, which then has to be stored to the DDR memory rapidly before being read out by a workstation.

SUMMARY

What is therefore desired are emulation systems and methods that can store useful quantities of trace data without being limited by trace data transfer bandwidth requirements and/or data storage requirements. What is further desired are emulation systems where some or all of the trace data from an emulation system may be compressed using a data compression algorithm and then stored for further processing.

In one embodiment, a system for compressing emulation frame data comprises a non-transitory storage medium configured to store frame data received from one or more emulation processors; and a controller configured to: determine a set of differential data between successive frame data; determine whether the set of differential data contains one non-zero value; generate a flag in a flag array indicating that the set of differential data contains one non-zero value in response to the controller determining that the set of differential data contains one non-zero value; and store index bits indicating position of the non-zero value within the set of differential data to the non-transitory storage medium, whereby the differential data is compressed based on the index bits.

In another embodiment, a system for compressing emulation frame data comprises a non-transitory storage medium configured to store frame data received from one or more emulation processors; and a controller configured to: determine a set of differential data between successive frame data; determine whether the set of differential data contains two non-zero values; generate a flag in a flag array indicating that the set of differential data contains two non-zero values in response to the controller determining that the set of differential data contains two non-zero values; and store index bits indicating the positions of the two non-zero values within the set of differential data to the non-transitory storage medium, whereby the differential data is compressed based on the index bits.

In yet another embodiment, a method for compressing emulation frame data comprises determining, by a controller, a set of differential data between successive frame data received from one or more emulation processors; determining, by the controller, whether the set of differential data contains one non-zero value; generating, by the controller, a flag in a flag array indicating that the set of differential data contains one non-zero value in response to the controller determining that the set of differential data contains one non-zero value; and storing, by the controller, index bits indicating position of the non-zero value within the set of differential data to a non-transitory storage medium, whereby the differential data is compressed based on the index bits.

BRIEF DESCRIPTION OF THE DRAWINGS

The accompanying drawings constitute a part of this specification and illustrate an embodiment of the subject matter described herein.

FIG. 3H shows a table of an 8-bit compression mode, according to an embodiment.

FIG. 3J shows a table of a 16-bit compression mode, according to an embodiment.

FIG. 3L shows a table for a data compaction format, according to an embodiment.

DETAILED DESCRIPTION

Figure 1:
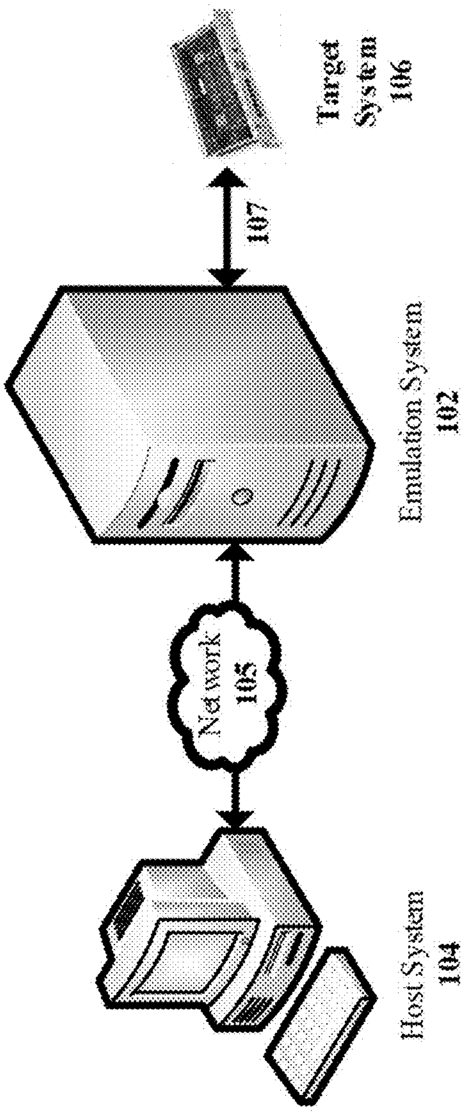
FIG. 1 shows an environment including an emulation system, according to an embodiment.

Embodiments disclosed herein describe methods and systems that store compacted and/or compressed frame data (also known as trace data) associated with frames generated during emulation of a circuit design. An emulation system may execute a data compaction technique and/or a data compression technique for compacting and/or compressing the frame data, and emulation system may store the compacted and/or compressed frame data for further analysis. The compaction and/or the compression of the frame data may include receiving the frames associated with the frame data from multiple clock cycles, and detecting any changes between any two successive frames from one clock cycle to the next clock cycle. When there is any change in data between the successive frames then the emulation system may store the frame data associated with the successive frames. The emulation system may execute some or all of the compaction and/or the compression of the frame data in real time while emulating a circuit design, and thus, some or all of the frame data is stored in compacted and/or compressed form in a memory while the circuit design is being emulated.

A trace subsystem may receive successive frames from the emulation processors in the emulation system and perform an XOR operation on the successive frames to determine if there has been a change in the data between the successive frames. The XOR operation may generate a differential frame data containing the changes between corresponding pair of successive pairs. In one compression mode, if the differential frame contains all 0s in a word (e.g., a byte) indicating that there has been no change in the data between the pair of successive frames, the trace subsystem may set a flag bit (e.g., flag bit=1) and not store the word. However, if the differential frame contains at least one binary value 1 indicating that there has been a change between the pair of successive frames, the trace system may set a flag bit (flag bit=0) and store the changed word. Therefore, the trace subsystem may significantly compress the trace data by storing only the words of the differential frame data that include a change. The trace subsystem may further store frame data at one or more locations for reference.

The trace subsystem may also execute a one-hot or two-hot compression modes to further compress the delta frame data generated by an XOR operation. For example, the trace subsystem may further compress a 16 bit frame data word with one non-zero bit (one-hot) or with two non-zero bits ("two-hot"). For the one-hot and two-hot compressions, the trace subsystem may utilize two flag bits to indicate four states: (i) flag=00 for a delta frame having all 0s, (ii) flag=01 for one-hot compression, (iii) flag=10 for two-hot compression, and (iv) flag=11 for non-compressed data. For the flags, the trace subsystem may output the following data to a memory: (i) for flag=00, no data output, total bits stored=2; (ii) for flag=01, data output=4 bit index of the non-zero bit, total bits stored=2+4=6; (iii) for flag=10, data output=4 bit index of the most significant non-zero bit and 4 bit index of the least significant non-zero bit, total bits stored=2+8=10; and (iv) for flag=11, output data=entire 16 bit data, total bits stored=2+16=18.

FIG. 1 shows an environment 100 of an emulation system 102 supporting trace data compression. The illustrative environment 100 may comprise a host system 104, an emulation system 102, a target system 106, a network 105, and a connection 107. The host system 104 may include one or more workstations that may run debug and runtime software interacting with the emulation system 102. The workstations may be any type of computing devices such as a desktop computers, laptop computers, tablet computers, and smartphones. The emulation system 102 may a combination of hardware and software modules which may emulate a design under test (DUT). The emulation system 102 may include clusters of interconnected ASICs, non-transitory memory devices, buffers, data storage devices configured to provide a system platform for emulating the DUT. The clusters may be arranged in multiple boards. The boards may be arranged within multiple racks. Multiple racks may be arranged in a plurality of emulation of devices, which may be analogous to multi-rack servers. The target system 106 may comprise hardware and/or software modules configured to interact with the DUT being emulated. For example, if the DUT is a design of a graphics processing unit (GPU), the target system 106 may be a motherboard configured to receive the GPU after fabrication. The target system 106 may be an external hardware environment provided by the user.

The network 105 may be any kind of communication link facilitating communication between the host system 104 and the emulation system 102. For example, the network 105 may a local area network may include a local area network (LAN), metropolitan area network (MAN), wide area network (WAN), and/or the Internet. The connection 107 may be also be any kind of communication link configured to facilitate a communication with the emulation system 102 and the target system 106.

The systems 102, 104, 106 of the environment 100 are merely illustrative and other configuration should be considered to be within the scope of this disclosure. For example, the network 105 may include a local connection 107 or a combination of multiple local interconnects. In some embodiments, the systems 102, 104, 106 may be local and housed within the same building. In other embodiments, one or more of the systems 102, 104, 106 may be accessed remotely. For example, the host system 104 may remotely access the emulation system 102 through the network 104 using a remote access protocol such as internet protocol (IP).

Figure 2:
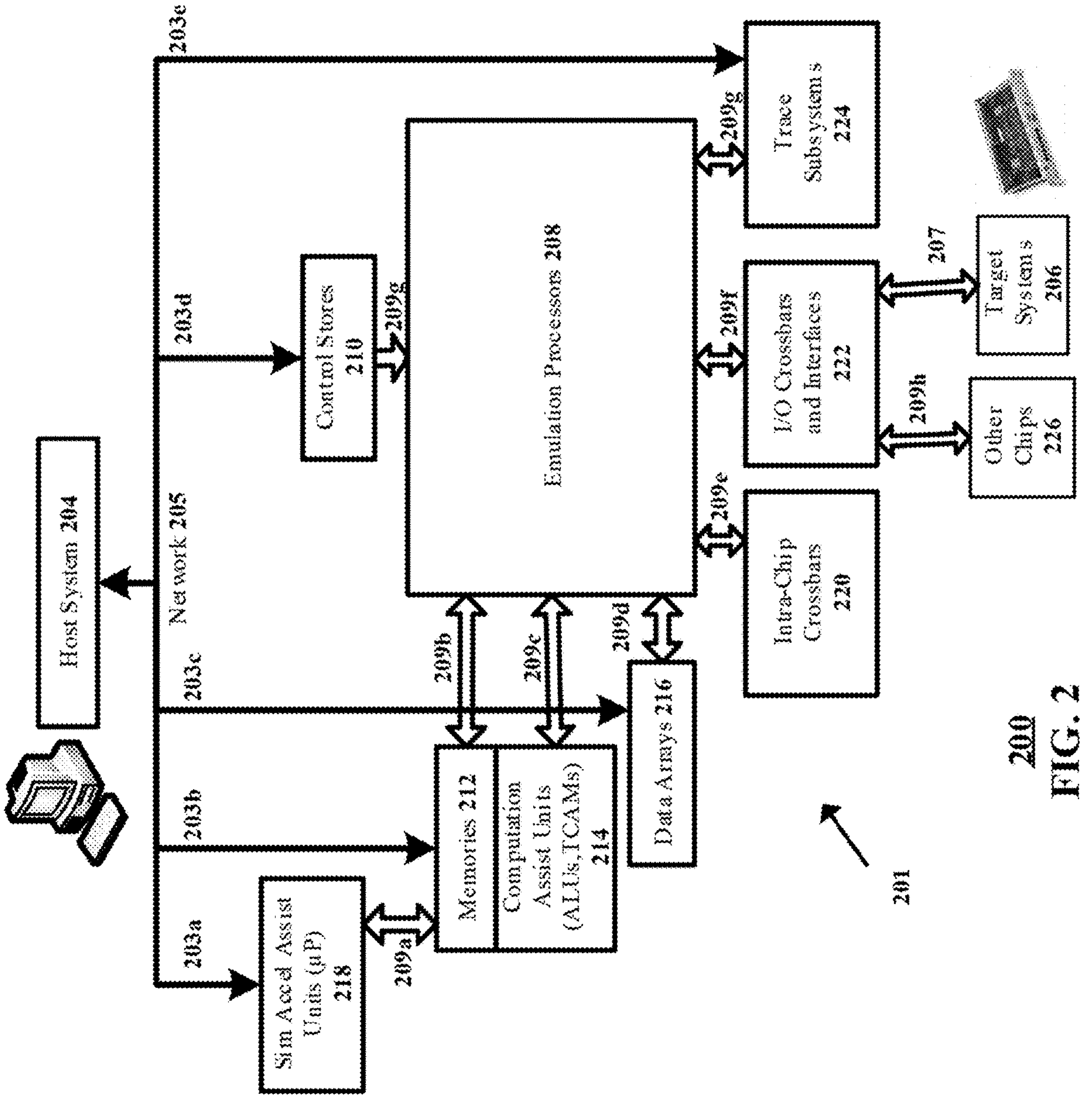
FIG. 2 shows another environment including an emulation processor, according to an embodiment.

FIG. 2 shows a more detailed view of the environment 200, particularly showing the components within an ASIC 201 of an emulation system (such as the emulation system 102 in FIG. 1). As shown, the ASIC 201 may include emulation processors 208, control stores 210, memories 212, computation assist units 214, data arrays 216, simulation acceleration assist units 218, intra-chip crossbar 220, input/output crossbars and interfaces 222, and trace subsystems 224. As shown, these components may be connected using the interconnects 209*a*-209*h*. Furthermore, a network 205 (similar to the network 105 in FIG. 1) connecting the host system 204 (similar to the host system 104 in FIG. 1) with the ASIC 201 may include connections 203*a*-203*e*.

Each ASIC in the emulation system may contain a large number of emulation processors 208 (also referred to as Boolean processors). The emulation processors 208 may retrieve a program containing instructions from the control store 210 and execute the program for one or more emulation cycles. For a DUT, the program may be the same for different emulation cycles, and the data on which the program operates may change because of the change in the states of the DUT from one cycle to other. These states, representing the state of the DUT's state elements, intermediate combinational nodes, and states of design memories are stored by a cluster of emulation processors 208 (typically a cluster of 8 emulation processors 208) into data arrays 216. In some embodiments, the cluster of emulation processors 208 may store the states into other larger memories 212 that may comprise internal memory (INTRAM) and external memory (EXTRAM).

The ASIC 201 may further include computation assist units 214 that the ASIC 201 may use to model functions that may be not be efficiently handled by general-purpose bitwise processors and generic memories. The computation assist units 214 may include hardware structures to perform arithmetic operations (ALUs) and to emulate ternary content-addressable memories (TCAMs). The ASIC 201 may also comprise simulation acceleration assistance units 218, which may be embedded microprocessors that may provide a capability for local processing of simulation acceleration or analysis tasks. The local processing of simulation acceleration may be implemented along with any other simulation acceleration at the host workstation 204.

The intra-chip crossbars 202 may provide an interface for the emulation processors 208 to interact with the other processors in other ASICs (not shown). The input/output (I/O) crossbars and interfaces 222 may provide an interface for the ASIC 201 to interact with the target systems 206 (similar to the target system 106 in FIG. 1) or other external chips 226. The target systems 206 and the external chips 226 may provide an external hardware environment for the DUT being emulated by the emulation system. The target systems 206 may be connected to the ASIC 201 using a connection 207 (similar to the connection 107 in FIG. 1).

In operation, the emulation processors 208 may emulate the DUT based on design inputs to the DUT. The design inputs may include a plurality of inputs over a plurality of clock cycles. The set of design inputs for each clock cycle may be input to one or more of the emulation processors 208. During emulation, and in response to the set of design inputs for each clock cycle, the emulation processors 208 may generate a large number of continuously varying states, as well as a plurality of design outputs. The states may represent the states of nodes within the DUT. For example, the states may include the states of the inputs and the outputs of the individual emulation processors 208. The states may be extracted and outputted by the emulation processors 208. The extraction of the state data may be referred to as the trace data, and may be stored in a trace subsystem 224. The trace subsystem 224 may collect and/or store the trace data including signals generated in the ASIC 201 (or the emulation system in general) during the execution of the DUT. The trace subsystems 224 may function in concert with compiler and runtime or offline debug code to collect and store the signals. The trace subsystems 224 may support two general modes of operations: (i) dynamic probes, which may allow a set of user-specified probes with deep traces, and (ii) full vision, which may allow reconstruction of all user signals without user specification and without performance impact.

Figure 3A:
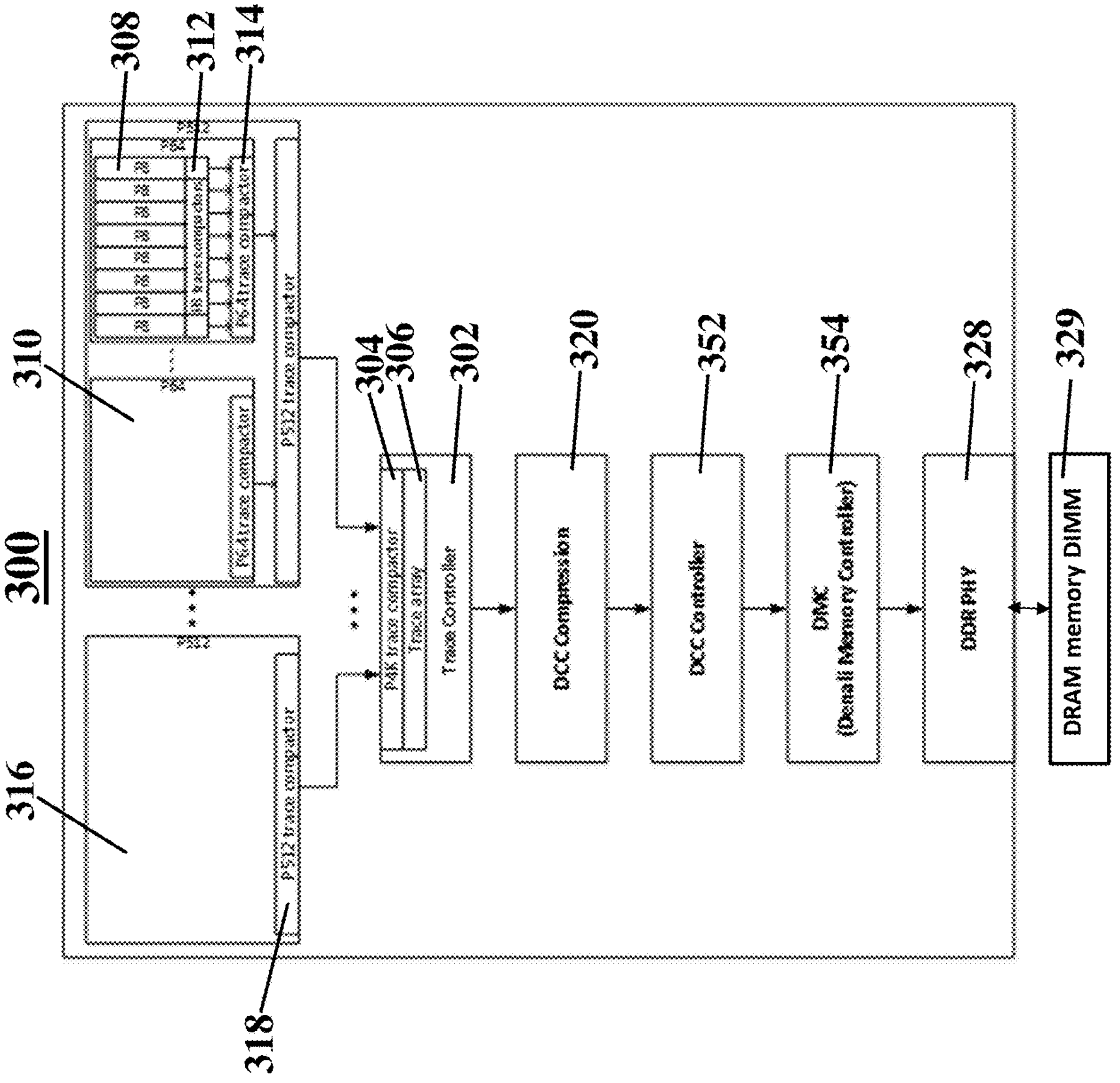
FIG. 3A shows a functional block diagram of a trace subsystem of an emulation chip of an emulation system, according to an embodiment.

FIG. 3A shows a functional block diagram of a trace subsystem 300 of an ASIC of an emulation system. The ASIC may include the trace subsystem 300, however, the trace subsystem 300 may be external to the ASIC, and some ASICs may not include the trace subsystem 300 as an integral component without departing from the scope of the disclosed embodiments.

The trace subsystem 300 may capture trace signal data (also known as frame data) during an execution of a design under test (DUT) so that signal waveforms within the frame data can be utilized and displayed by a circuit designer on a graphical user interface of a designer user device for further processing and analysis. In operation, the circuit designer may emulate the DUT by running an emulation system, and operate the DUT up to a point where an error condition may occur. The DUT may have flaws or bugs that should be fixed before they can be implemented in a target electronic circuit. During emulation, the trace subsystem 300 may then be used as an aid in analyzing and debugging the DUT under development. The trace subsystem 300 may capture and store frame data corresponding to a record of changing states of signal inputs, signal outputs and internal signals of the DUT being emulated. The states may be stored once per clock cycle of the ASIC. It shall be appreciated that the states may not be stored in the trace subsystem 300 based on the clock cycle of the ASIC and may be stored based on one or more rules defined by the circuit designer without departing from the scope of the disclosed embodiments. The trace subsystem 300 may continue to collect signal states and the changing states of the signal inputs, the signal outputs and the internal signals of the DUT being emulated, but at some point tracing may be stopped to allow the circuit designer to examine the record of signal states to determine what events caused the error. Alternatively, the operation of the DUT may be permitted to continue past the error condition so that the circuit designer has a record of events that occur after the error condition. In this way, the record of the signal states provided by the trace subsystem 300 aids the circuit designer in developing a target electronic circuit.

The trace subsystem 300 may include a trace controller 302, which may capture the frame data corresponding to a record of changing states of signal inputs, signal outputs and internal signals of the DUT being emulated. Upon capturing the frame data, the trace controller 302 may then compact some or all of the frame data, and store compacted frame data. The trace controller 302 may use a data compaction technique and/or a data compaction algorithm to compact some or all of the frame data, and then store the compacted frame data. The trace controller 302 may include one or more trace compactors 304 for compacting the frame data, and a trace array 306 for storing the compacted frame data.

Emulation processor clusters of the ASIC may include a P8 emulation processor 308. The P8 emulation processor 308 may include a group and/or a cluster of eight emulation processors. The P8 emulation processor 308 is a processor cluster, and a feature of the P8 emulation processor 308 is that all emulation processors in the same P8 emulation processor 308 share a common data array. Also, the outputs produced by one emulation processor of the P8 emulation processor 308 is visible to other emulation processors in the same P8 emulation processor 308 equally along with its own outputs. The emulation processor clusters may further include a P64 emulation processor 310. The P64 emulation processor 310 may include a group and/or a cluster of eight P8 emulation processors 308. The P64 emulation processor 310 may be utilized for emulation process implementation such that sufficient emulation processors can be grouped together to interact with several components within the ASIC. The emulation processor clusters may further include a P512 emulation processor 316. The P512 emulation processor 316 may include a group and/or a cluster of eight P64 emulation processors 310. The P512 emulation processor 316 may include various emulation processors that interact with several components of the ASIC.

In operation, various emulation processors of various emulation processor clusters while emulating an electronic circuit design may produce data, such as, trace data. A trace controller 302 may then tag all the data produced by the various emulation processors. The trace controller 302 may then process and analyze the tagged data in order to determine whether the data should have never been captured, the data may be captured during Flip-Flop (FF) cycles, the data may be captured during Primary Input (PI) cycle, or the data may be captured during both the FF cycle and PI cycle. The trace controller 302 may then transmit the data to various trace compactors 302, which may include data compaction structures distributed at each level of hierarchy of the various emulation processor clusters such as the P8 emulation processors 308, the P64 emulation processors 310, etc. The trace compactors 304 may process the data to squeeze out the bubbles from the valid data to compact the data, and then output the compacted data to additional components of the trace subsystem 300 for further processing and analysis. The compaction of the data may involve ripple shifting the data based on the valid partial lines, and emitting a line of data whenever a complete one is formed.

The compaction process of the data may start with operations at the P8 emulation processors 308. In each P8 emulation processor 308, at each emulation step, any subset of eight bits of the data generated by the P8 emulation processor 308 is captured. A P8 emulation processor trace compactor 312, which is a trace compactor associated with the P8 emulation processor 308 stores the eight bits of the data. The P8 emulation processor trace compactor 312 then emits a byte upon receiving the eight bits of the data. Accordingly, the input of the P8 emulation processor trace compactor 312 has the eight bits of the data and eight valid bits, and the compacted output of the P8 emulation processor trace compactor 312 has an 8-bit value and one valid bit.

In operation, at the P8 emulation processors 308, the trace controller 302 may execute a compaction technique and/or a compaction algorithm to capture the 8 data bits and the 8 enable/valid bits produced in each emulation step by the P8 emulation processors 308. The trace controller 302 then identifies all data bits with an active enable indicator. Upon identification of the data bits with the active enable indicator, the trace controller 302 then packs all the data bits with the active enable indicator. The trace controller 302 then stores all the data bits with the active indicator. The trace controller 302 stores all the data bits with the active indicator until 8 valid bits have been accumulated, at which point the 8 bits of compacted data are then passed to a next stage of a compaction process in a compaction tree of the trace subsystem 300. In some cases, the trace controller 302 may split the trace data evaluated in a same emulation step, i.e. if 6 data bits are enabled in the emulation step 0, and 6 more data bits are enabled in the emulation step 1, 4 data bits from the emulation step 1 may be left in the P8 emulation processors 308, until such time as another emulation step (or emulation steps) accumulated 4 more data bits. The compaction technique and/or the compaction algorithm is implemented with a 16 bit data register and a 16 bit valid register. Each of the 16 data bits may be fed by an 8-way multiplexer into the 16 bit data register and the 16 bit valid register, where a select signal of the 8-way multiplexer is controlled by the valid indicator data bits and incoming valid bits, so that the incoming data bits for a given emulation step are packed up against the data bits saved from the previous emulation step.

Figure 3B:
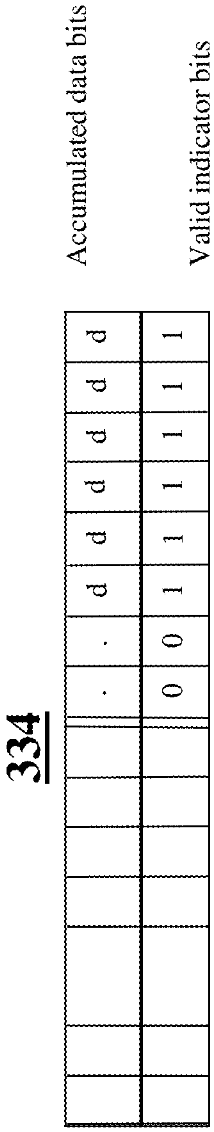
FIG. 3B shows an example of a data compaction process in P8 emulation processors, according to an embodiment.
Figure 3C:
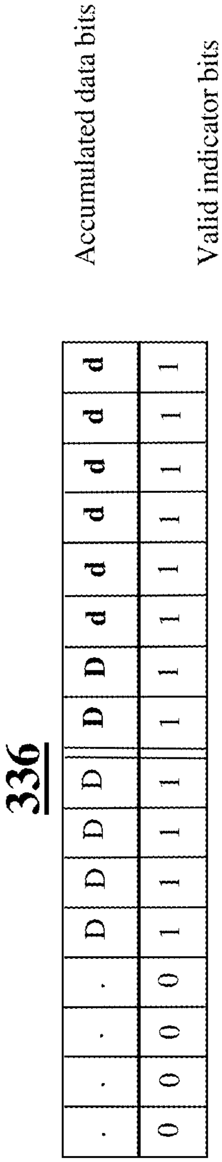
FIG. 3C shows an example of a data compaction process in P8 emulation processors, according to an embodiment.
Figure 3D:
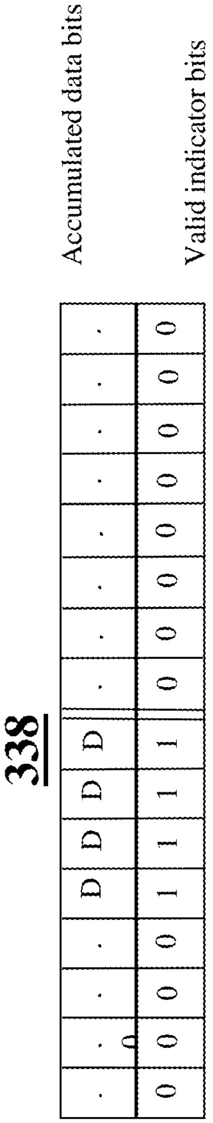
FIG. 3D shows an example of a data compaction process in P8 emulation processors, according to an embodiment.

FIGS. 3B-3D show examples of a data compaction process in P8 emulation processors. The P8 emulation processors may generate data bits during emulation cycles. The valid data bits among all the data bits may then be compacted. As shown, “d” may indicate 6 valid data bits accumulated from the P8 emulation processors during a first cycle in a first step 334, and “D” may indicate another 6 valid data bits accumulated from the P8 emulation processors during a second cycle in a second step 336. As soon as the total of the 8 valid data bits have been accumulated, as depicted in the FIG. 3C, then in a third step 338, the trace controller 302 may transmit the 8 valid data bits to a next stage in a compaction tree, as depicted in the FIG. 3D.

As represented in the FIGS. 3B-3D, during the first step 334, when the valid output data bit is “0”, no data is propagated to the P64 emulation processor 310, but in the second step 336, the valid output bit will be “1” and the data “DDdddddd” (6 data bits from the first step 334 and first 2 data bits from the second step 336) will be propagated to the P64 emulation processor 310. In some embodiments, in order to avoid the data being left behind in a last step of a major emulation cycle, a scheduler of the emulation system may collect a multiple of 8 data bits from each P8 emulation processor 308, which may be accomplished by scheduling a number of dummy capture bits in a last step of the emulation cycle.

At a next level in a hierarchy of the emulation processor clusters in the ASIC are P64 emulation processors 310. In each P64 emulation processor 310, at each emulation step, 8 valid or invalid bytes from the P8 emulation processors 308 are received. A P64 emulation processor trace compactor 314, which is a trace compactor associated with the P64 emulation processor 310 receive the 8 valid or invalid bytes from the P8 emulation processors 308, and then emits a valid 64-bit value whenever 8 valid or invalid bytes are received from the P8 emulation processors 308. Accordingly, the input of the P64 emulation processor trace compactor 314 has the 8 valid or invalid bytes received from the P8 emulation processors 308, and the compacted output of the P64 emulation processor trace compactor 314 has a valid 64-bit value.

In operation, in each P64 emulation processor 310, a compaction algorithm is implemented that collects a groups of bytes (such as 8 bits) from the P8 emulation processors 308, and as the 8 bits become valid, and when the 8 bytes have been accumulated, the received data bits are then forwarded to the P512 emulation processor 316. The compaction algorithm is implemented in the P64 emulation processor 310 with 16 byte-wide (8 bit) registers and a 16 bit valid register.

Figure 3E:
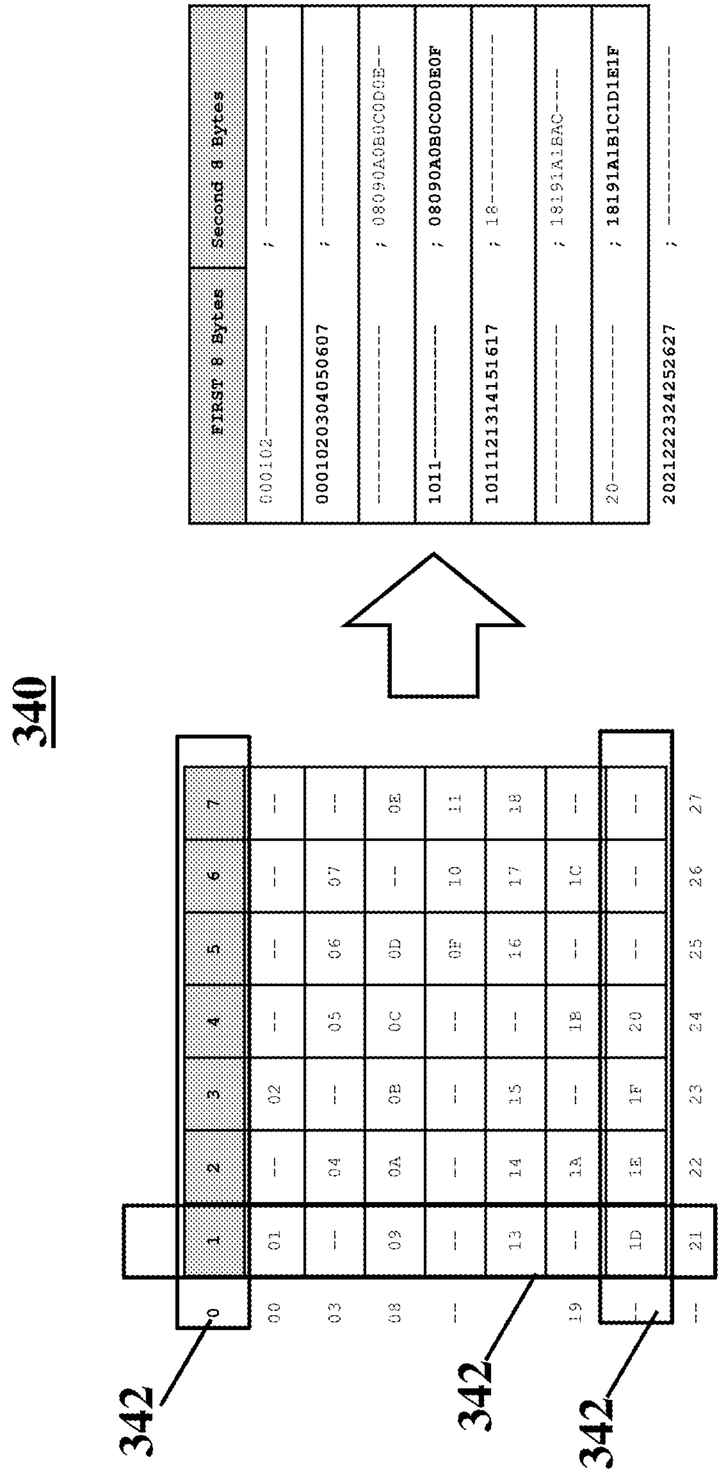
FIG. 3E shows a table illustrating data associated with a data compaction process in P64 emulation processors, according to an embodiment.

FIG. 3E shows a table 340 illustrating data associated with a data compaction process in P64 emulation processors. The left hand side of the table 340 shows headings 342 presenting bytes of valid data 0 through 7 respectively received from the P8 emulation processors 308. The table 340 further shows the collection of the data across 8 emulation steps. The right hand side of the table 340 shows that the data is accumulated in a register until a full 8 bytes are valid, at which point the full 8 bytes are propagated to the P512 emulation processor 316.

At a final level in a hierarchy of the emulation processor clusters in the ASIC are P512 emulation processors 316. In each P512 emulation processor 316, at each step, 64 valid or invalid bytes from the P64 emulation processors 310 are received. A P512 emulation processor trace compactor 318, which is a trace compactor associated with the P512 emulation processor 316 receive the 64 valid or invalid bytes from the P64 emulation processors 310, and emits a valid 512-bit value whenever the 64 valid or invalid bytes are received from the P64 emulation processors 310. Accordingly, the input of the P512 emulation processor trace compactor 316 has the 64 valid or invalid bytes received from the P64 emulation processors 310, and the compacted output of the P512 emulation processor trace compactor 316 has a valid 512-bit value.

The P512 emulation processor trace compactor 316 may transmit a valid 512-bit value to a trace array 306. In operation, at the P512 emulation processor 316, groups of 8 bytes (64 bits) of the data from the P64 emulation processors 310 is accumulated until a group of 512 data bits is ready to be transmitted for writing into the trace array 306. In some embodiments, because all (for instance, up to 8) P512 emulation processors 316 may have blocks of the output data ready for transmission at a same time, the trace array 306 may physically be implemented in an optimum size (such as 4*k* data bits wide) so that all the data from all the P512 emulation processors 316 is written in the trace array 306 in a single step. In any given step, 0-8 512-bit blocks of the data may need to be written from the trace compactors 304 into the trace array 306, and accordingly the trace array 306 address pointers to the 512 bit blocks of the data may consist of 11 bits to address the 2 k depth of the memories, and at least 3 more data bits to address the 8 512-bit blocks across the 4 k width, for a total of 14 data bits (16 k 512-bit blocks).

Various trace compactors 304 may compact the data until a trace array 306, which is a central collection storage unit and includes a random access memory (RAM) receives either a valid or an invalid 512-bit value from the P512 emulation processor trace compactor 316. The trace array 306 stores the valid or the invalid 512-bit values received from the P512 emulation processor trace compactor 316, and based on controls from various sequencers and virtual logic circuits, determine which cycles of the data together form a frame. The sequencer may provide timing information to the emulation chip, read addresses to the trace array 306 and provides sequential write addresses to the trace array 306. The sequencer starts at an initial value and increments to a maximal value. Each increment of the sequencer causes the step value to advance from zero towards the maximal value, and is equivalent to a step. Collectively, all of the steps form one cycle. The cycle is complete once the sequencer reaches its maximal value. Upon reaching its maximal value, the sequencer begins counting again from its initial value and a new cycle is initiated.

The collection of the compacted data in the trace array 306 is organized into frames (1 to n emulation cycles), and controlled by a hardware control bit (HCB) called "Start_Frame", which is further controlled by a scheduler and virtual logic circuits, as well as a timing signal "Start_Cycle" from the sequencer. The HCB is a mechanism where the scheduler transmits scheduled signals to ASIC hardware resources such as a controller during the execution of the cycle. In operation, the "Start_Frame" HCB is set (high) in a step near an end of a preceding emulation cycle/frame, and a new frame essentially starts immediately after the step that both "Start_Frame" and "Start_Cycle" are high. By default, in a normal mode of operation of the emulation system, the sequencer transmits "Start_Cycle" HCB to the controller just before each cycle starts, and therefore the capture of the data may begin in a very first step. Any capture of the data between the "Start_Frame" and the "Start_Cycle" is stored as part of the preceding frame. The "Start_Frame" HCB is cleared (set low) before the next "Start_Cycle" to continue capture of the data into the same frame during the next emulation cycle. The HCB is transmitted to allow the operation of the controller where the "Start Frame" is set in the beginning of the cycle (ignoring "Start Cycle") and the capture of the data can begin immediately after the rise of the "Start_Frame". In either case, the "Start_Frame"/"Start_Cycle" combination implicitly marks the end of the previous frame.

Figure 3F:
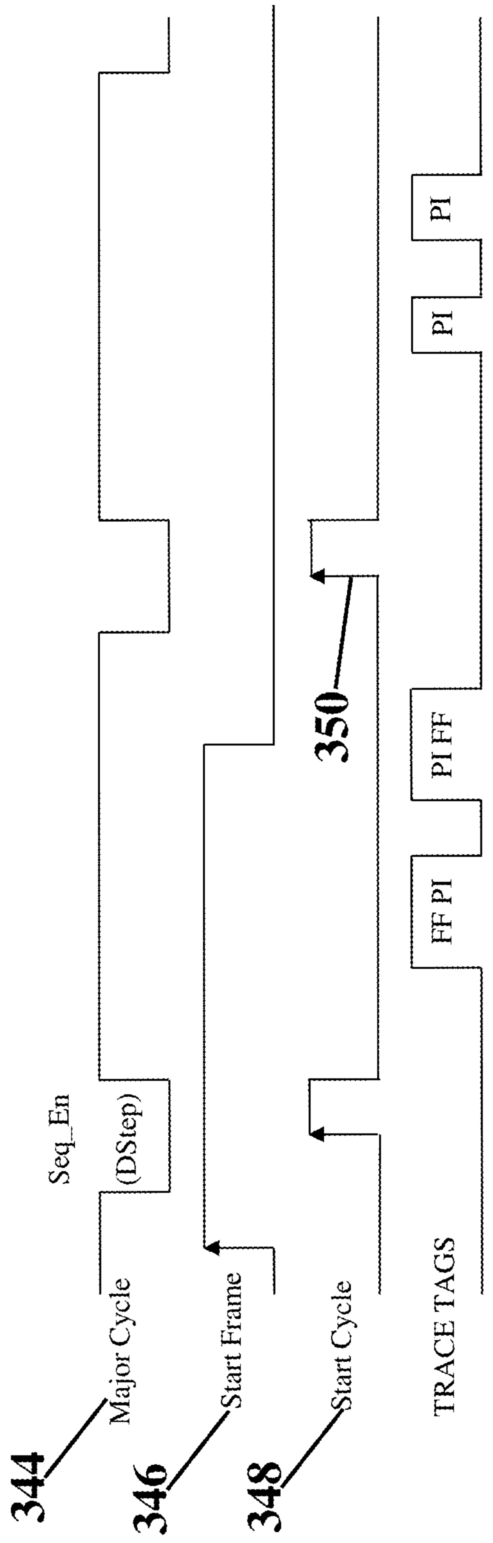
FIG. 3F shows signals associated with various emulations cycles, according to an embodiment.

FIG. 3F shows various cycles where a duration of a major cycle 344 is designated by a hardware signal "Sequencer_Enable" (Seq_En). The indication of the FF data and the PI data illustrate that in a first cycle 346 of a frame 348, when both types of the data (the FF data and the PI data) are collected, the FF data and the PI data are intermixed, and in subsequent cycles 350 when only PI data is collected, the location of the PI data will likely be different than what was the location of the PI data in the first cycle.

An output, which is frame data associated with frames captured by the trace controller 302 is then written into a memory. Conventionally, the output from the trace controller 302 is directly written to a DCC memory, which has several problems because of the limited size of the DCC memory. In order to overcome the problems associated with the conventional method of writing the output data directly from the trace controller 302 into the limited size DCC memory, an inline compression engine 320 (also called as a DCC compression engine) is utilized to compress the output data prior to writing the output data into the memory. The operation of the inline compression engine 320 solves the problems associated with the conventional methods, and offers a number of benefits. For instance, currently since there is more volume of the output data (frame data) because the emulation processors are running faster with more capacity, the inline compression engine 320 helps to keep up with the throughput to the DCC memory, which is not significantly increased. The compression of the output data by the inline compression engine 320 also results in getting additional trace depth. Furthermore, there is no extra overhead to performing the compression before upload of the output data. In some embodiments, when the inline compression engine 320 is utilized to compress the output data prior to writing the output data and balance the DCC memory throughput to the cycle period, then a controller may execute a back-pressure mechanism to stall or slow down the emulation run if the throughput to the DCC memory is exceeded. The back-pressure may allow the inline compression engine to indicate to the emulation system that the DCC memory may be full or near-full and the emulation system may have to stall one or more emulation cycles until the content of the DCC memory is downloaded to a workstation.

In operation, during the emulation of the DUT, the data is captured. The data captured during various emulation cycles is referred to as a frame. The frame may consist of the data associated with 32 or 64 emulation cycles. After all the data for the frame is captured, compacted, and collected in a trace array 306, the trace array 306 may hold up to 3 frames of data in a full vision mode that is filled by the captured data, and up to 6 frames of the data in a DYNP mode that is waiting for a capture/discard decision. For instance, the data may be held in the trace array 306 for up to 1 additional frame in the full vision mode, and up to 3 additional frames in the DYNP mode, until a logic trigger condition is evaluated to indicate whether to store the frame's worth of data to a data capture card (DCC) memory or to discard the data. Such conditional acquisition of the data in the trace array 306 is controlled by additional HCB signals set by a compiler, such as, "Capture_Current_Frame" and "Discard_Current_Frame" that selects whether to further store or discard the data associated with the complete frame. In some embodiments, two separate and additional bits are used to explicitly indicate the decision to further store or discard the data based on a value of one of the two additional HCB signals at a start of each cycle.

In a full vision trace mode, the trace array 306 may hold 3 frames of the data where the data associated with each frame may be up to 1 MB in size. One frame data may be held in one of 3 frame buffers of the trace array 306. The new trace data is loaded to a next frame buffer of the trace array 306 during which capture/discard signal is received from a controller for the data associated with the previous frame. Accordingly, based on the capture/discard signal, the data associated with the previous frame will start getting unloaded at a start of a next frame boundary. Therefore, during a next cycle, the data associated with the previous frame is unloaded from the trace array 306 to an XOR gate circuit, while the next set of trace data is loaded to a third frame buffer of the trace array 306, and so on. In some embodiments, the capture/discard decision for the data associated with the previous frame in the full vision trace mode may be delayed up to one frame.

In a DYNP trace mode, the trace array 306 may hold 6 frames of the data where the data associated with each frame may be up to 0.5 MB in size. The data associated with the adjacent frames is stored in a same trace buffer of the trace array 306 as the unloading of the data associated with the first frame does not start up to a third frame cycle. In some cases, the data associated with one frame is held in a first half of the 3 frame buffers of the trace array 306. The new trace data will then be loaded to a second half of a same frame buffer during which capture/discard indication is received for the data associated with the previous frame. The data associated with the previous frame will start getting unloaded at a start of next frame boundary. During the next cycle, the data associated with the previous frame is unloaded from the trace array 306 to an XOR gate circuit, while the next trace data is loaded to the first half of the $2^{nd}$ frame buffer, and so on. In some embodiments, the capture/discard decision for the data associated with the previous frame in the DYNP trace mode may be delayed up to one to two frames.

With the capture of frame data (that may be anywhere between 0-4 k bits) associated with the frames in the trace array 306 in any of the steps, a data-compression function of a compression logic circuit of the inline compression engine 320 is then executed to pack all the desired data bits into larger blocks before writing the compressed data bits into a DCC memory such as a DRAM memory 329 to improve both the trace capture and the memory efficiency. For instance, the newly captured frame data from the trace array 306 is XORed with the previously captured frame data stored in the trace array 306 using XOR gate circuits, and the XORed data output from the XOR gate circuits is then compressed using a data compression logic of the inline compression engine 320 before transmitting out the compressed data to the DRAM memory 329. In some embodiments, the XOR function of the XOR gate circuits is executed on 512 data bits at a time, and the XORed data is then transmitted to the compression logic of the inline compression engine 320 for compressing the XORed data output. The compressed XORed data output is then sent to the DRAM memory 329. A DCC controller 352 and a Denali memory controller (DMC) 354 may facilitate the transmission of the compressed XORed data output from the inline compression engine 320 to the DRAM memory 329. The DRAM memory 329 may be located outside the ASIC containing the trace subsystem 300. The DRAM memory 329 may be connected to the ASIC through a physical layer block 328 that may provide a coupling between the ASIC and the DRAM memory 329.

The XOR gate circuits that may receive newly captured frame data stored from the trace array 306 and the previously captured frame data stored in the trace array 306 as inputs may be enabled or disabled by a software program being executed by a controller. The controller may generate instructions to execute the software program to enable the XOR gate circuits so that the newly captured frame data from the trace array 306 is XORed with the previously captured frame data stored in the trace array 306 using the enabled XOR gate circuits. The XOR gate circuits may then generate the XORed data output, which may initially be stored in a XOR memory. The XOR gate circuits are coupled to the XOR memory, which may receive the XORed data output from the XOR gate circuits. In some embodiments, the size of the XOR memory is equal to a size of one frame buffer (for example, 1 MB). In some embodiments, when the XOR gate circuits are enabled, a most recent frame received from the trace array 306 that is sent to the DRAM memory 329 is also stored in the XOR memory. Except for the first frame, the rest of the frame data received from the trace array 306 is then XORed with previously stored frame from the XOR memory. The XOR gate circuits may then output the XORed data output, which is subsequently compressed and stored into the DRAM memory 329.

Figure 3G:
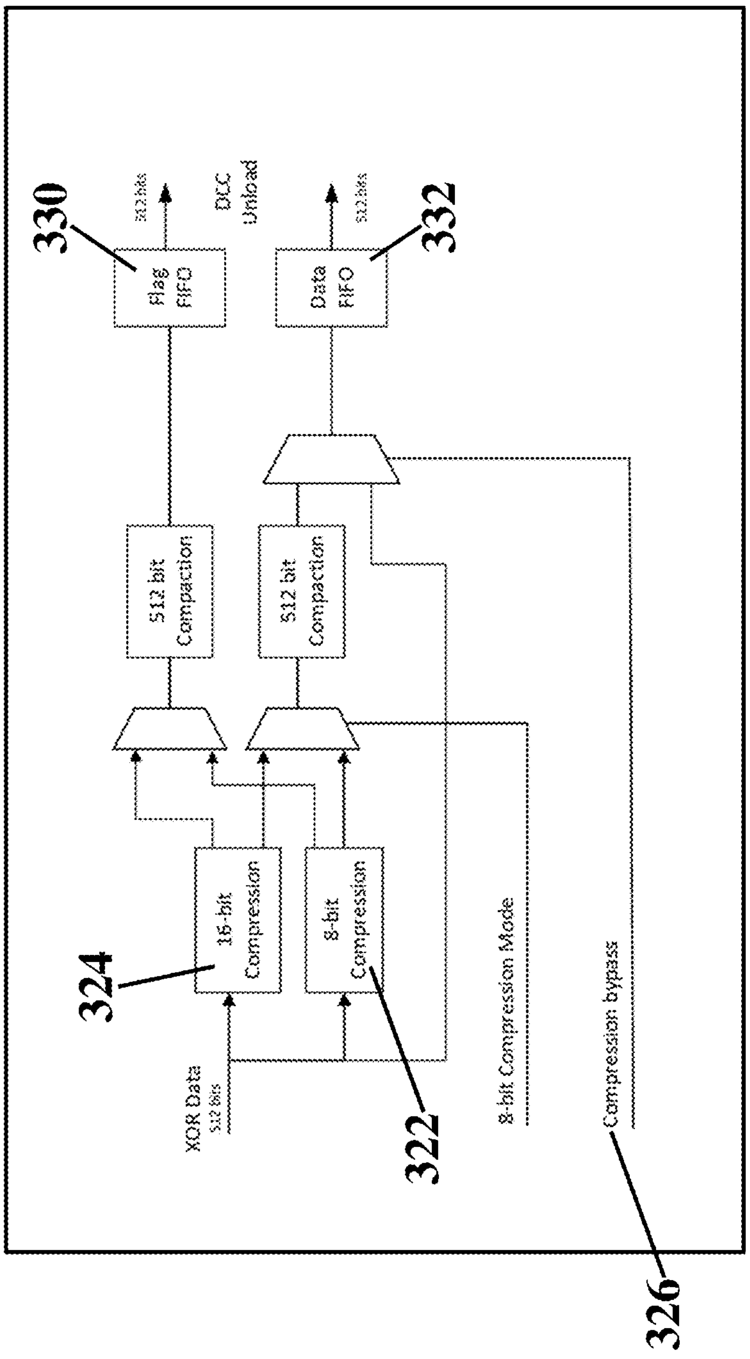
FIG. 3G shows a functional block diagram of a compression logic circuit of a trace subsystem, according to an embodiment.

The XORed data output is compressed using various compression modes before the DCC controller 352 and the DMC 354 transmits the XORed data output to the DRAM memory 329, and consequently the DCC controller 352 and the DMC 354 only transmits the compressed XORed data output to the DRAM memory 329. The multiple compression modes that may be used to compress the XORed data output may include an 8-bit compression mode comprising a 8-bit compression circuit 322 and a 16-bit compression mode comprising a 16-bit compression circuit 324 (as depicted in the FIG. 3G). In some embodiments, at least one compression mode is enabled by default in the trace subsystem 300 to perform the compression of the data, but a software associated with the inline compression engine 320 upon receiving instructions (such as a compression by pass signal 326) from the inline compression engine 320 may configure the trace subsystem 300 in order to bypass all the compression modes during the operations of the trace subsystem 300. The 16-bit compression mode is a default option set up in the trace subsystem 300, but the trace subsystem 300 may be structured for the 8-bit compression mode as the default option.

During an 8-bit compression mode, a controller may execute a compression algorithm on 8-bits of the incoming XORed data output from the XOR gate circuits. Upon execution of the compression algorithm, each byte of the 512-bit XOR word is translated to a compressed format, which may have variable length of data, as depicted in the FIG. 3H.

Figure 3I:
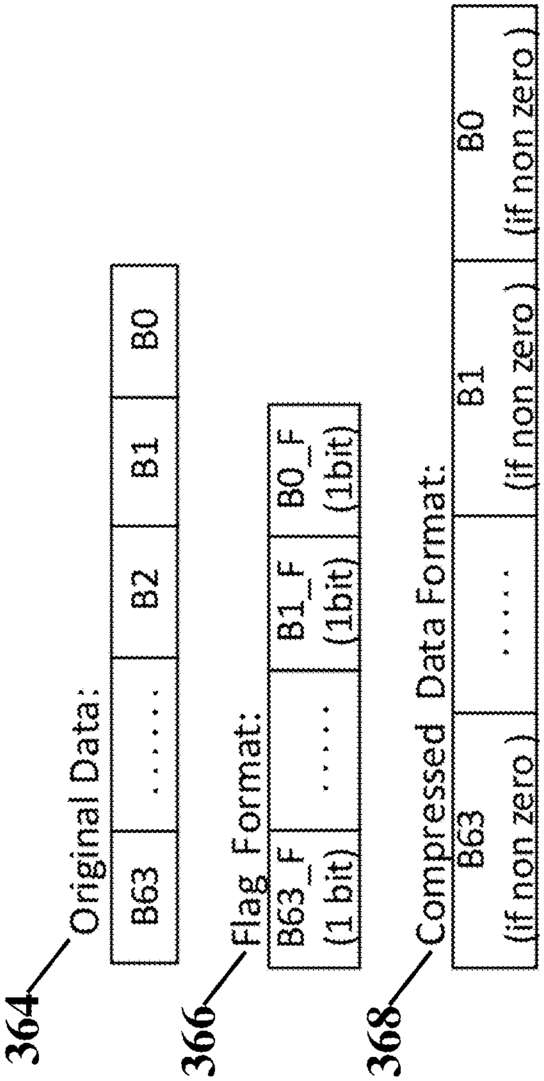
FIG. 3I shows a compressed data format with an 8-bit compression, according to an embodiment.

In operation, a controller may check a value of each input data byte 356 of the XORed data output. When the controller determines that the value of all bits in the input data byte 356 of the XORed data output to be 0, then the controller may assign a value of a corresponding flag 358 as 1. When the value of the flag 358 is 1, then no output data is written into the DRAM memory 329, that is, the output data byte 360 will be none. The controller may compress the 8 bit of data to a total 362 of 1 bit (just the flag bit) when the value of all bits in the input data byte 356 is determined to be 0. However, when the value of the input data byte 356 is anything other than 0, that is, the value of one or more bits in the input data byte 356 is not zero, then the controller assigns a value of a corresponding flag 358 as 0, and the controller transmits a total 362 of 9 bits including the entire input byte and the flag bit of the data into the DRAM memory 329. Accordingly, in the 8-bit compression mode, the controller converts the 512 bits of the input data 356 to variable length of data with minimum of 0 bits to a maximum of 512 bits, and fixed 64 bits of flags. FIG. 3I depicts original data 364, a flag format 366, and a compressed data format 368 stored in the DRAM memory 329.

In some embodiments, an interface to the DRAM memory 329 is fixed 512 bits, and the compressed data with minimum of 0 bits to a maximum of 512 bits is further compacted and then stored in a data FIFO 332. In some embodiments, the fixed 64 bits of flags are also compacted and then stored into a flag FIFO 330. The controller may execute a compaction technique for further compaction of the compressed data and flags prior to storage in the data FIFO 332 and the flag FIFO 330.

During a 16-bit compression mode, a controller may execute a compression algorithm on 16-bits of the incoming XOR data from the XOR gate circuits. Every two bytes of the 512-bit XOR word is translated to a compressed format, which may have variable length of data, as depicted in the FIG. 3J.

In operation, a controller may check a value of two input data bytes 370 (which may be 2 bytes or 16 bits) of the XORed data output. When the controller determines that the value of all bits in the two input data bytes 356 of the XORed data output to be 0, then the controller may assign a value of a corresponding flag 372 as 00. When the value of the flag 372 is 00, then no output data is written into the DRAM memory 329, that is, the output data 374 will be none. The controller may compress the two input data bytes 370 of the XORed data output to a total 376 of 2 bits (only the flag bits) when the value of all bits in the two input data bytes 370 is determined to be 0. However, when the value of a bit in one of the two input data bytes 370 is anything other than 0, that is, the value of a bit in one of the two input data bytes 370 is 1 (one-hot), then the controller assigns a value of a corresponding flag 372 as 01, and the controller transmits a total 376 of 6 bits into the DRAM memory 329. The total 376 of 6 bits includes 2 bits of flag value and an output data 374 containing four bits corresponding to an index position of the 1 bit in the two input data bytes 370.

Figure 3K:
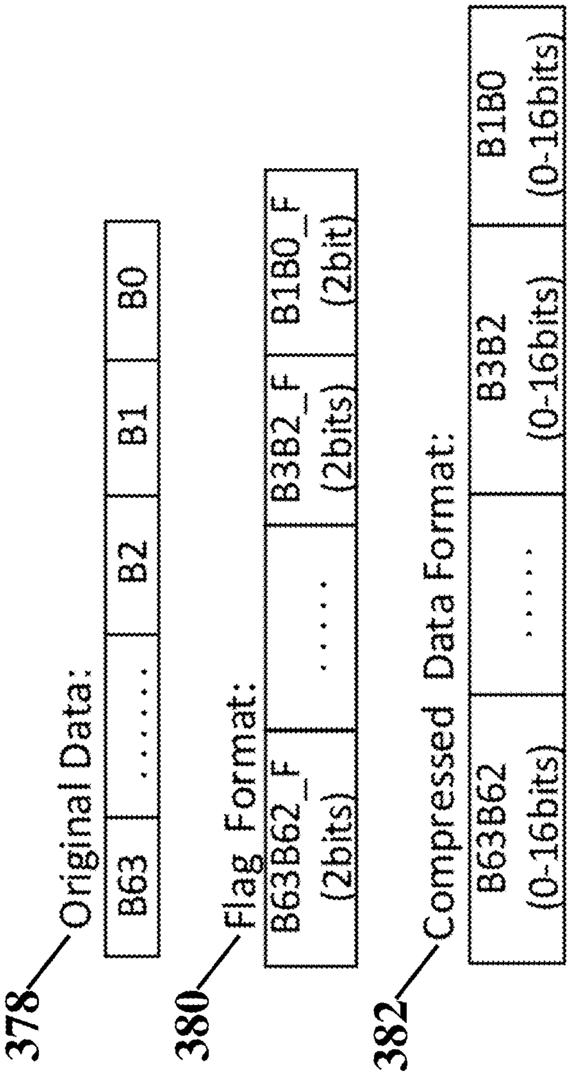
FIG. 3K shows a compressed data format with a 16-bit compression, according to an embodiment.

When the value of two bits in one of the two input data bytes 370 is anything other than 0, that is, the value of two bits in one of the two input data bytes 370 is 1 (two-hot), then the controller assigns a value of a corresponding flag 372 as 10, and the controller transmits a total 376 of 10 bits into the DRAM memory 329. The total 376 of 10 bits includes 2 bits of flag value and the output data 374 containing first four bits corresponding to an index position of most significant 1 bit and second four bits corresponding to an index position least significant 1 bit in two input data bytes 370. When the value of the two input data bytes 370 is random value, then the controller assigns a value of a corresponding flag 372 as 11, and the controller transmits a total 376 of 18 bits including the entire two input data bytes 370 of the data and the two bits of the flag into the DRAM memory 329. Accordingly, with the 16-bit compression mode, the controller converts the 512 bits of input data to variable length of data with minimum of 0 bits to a maximum of 512 bits, and fixed 64 bits of flags. The controller then stores the variable length of data with minimum of 0 bits to a maximum of 512 bits in the DRAM memory 329. FIG. 3K depicts original data 378, a flag format 380, and a compressed data format 382 stored in the DRAM memory 329.

In some embodiments, an interface to the DRAM memory 329 is fixed 512 bits, and the compressed data with minimum of 0 bits to a maximum of 512 bits is further compacted and then stored in a data FIFO 332. The controller may execute a compaction algorithm for further compaction of the compressed data and storage in the data FIFO 332. The compaction algorithm may compress input data (compressed data) 386 into an output data (compacted compressed data) 388 as depicted in table 384 shown in the FIG. 3L. In the output data (compacted compressed data) 388, each word may include 8 units.

Figure 3M:
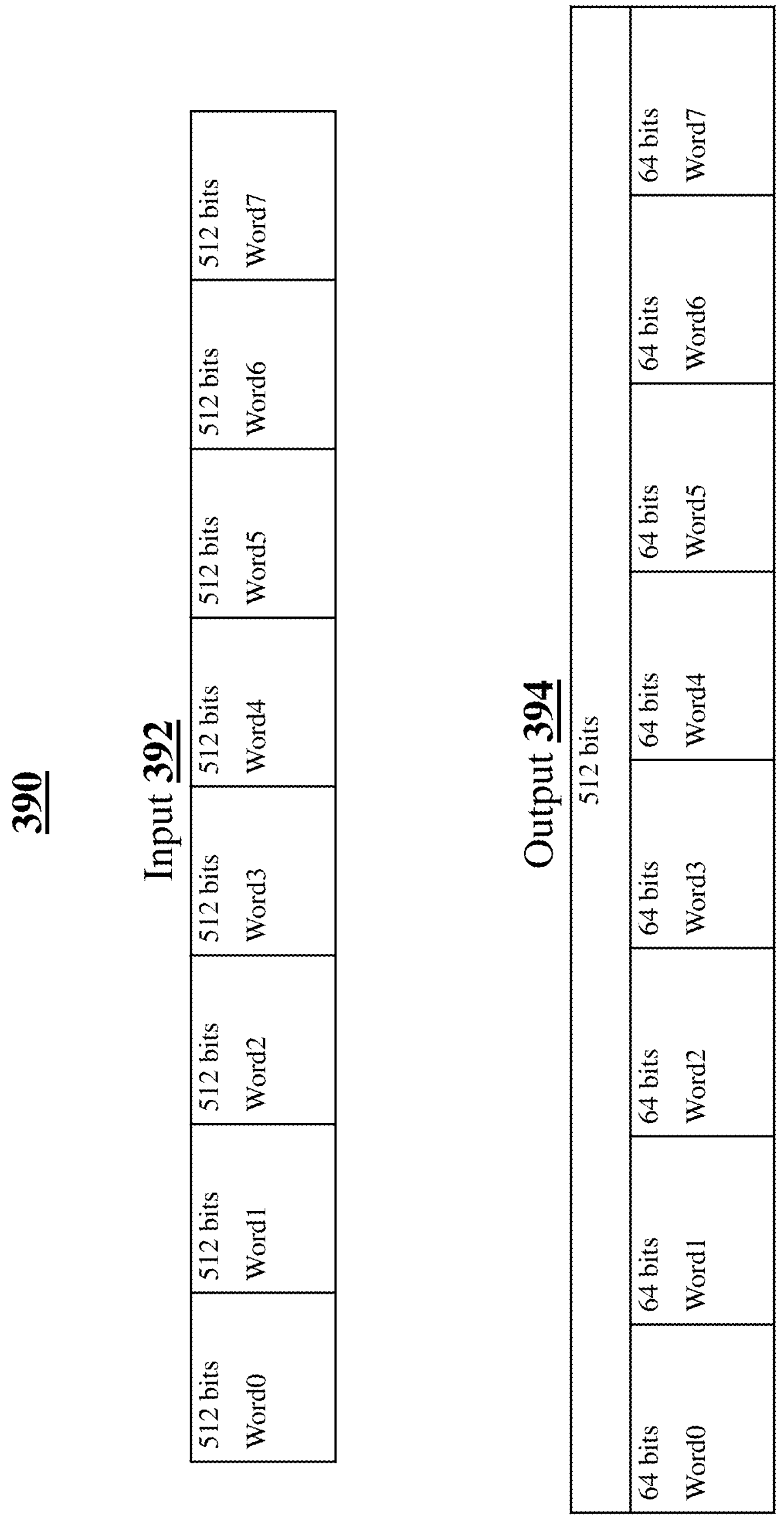
FIG. 3M shows a table for a flag compaction format, according to an embodiment.

The fixed 64 bits of flags are also compacted and then stored into a flag FIFO 330. The controller may execute a compaction algorithm for further compaction of the compressed flags and storage in the flag FIFO 330. The compaction algorithm may compress input data (flags) 392 into an output data (compacted flags) 394 as depicted in table 390 shown in the FIG. 3M. In the output data (compacted compressed data) 388, each word may include 8 units. In the input data 392, each element is 512 bits and an input order of all words starts from index 0 to 7. In the output data 394, each element is 64 bits and 8 elements forms a 512 bit word.

Figure 4:
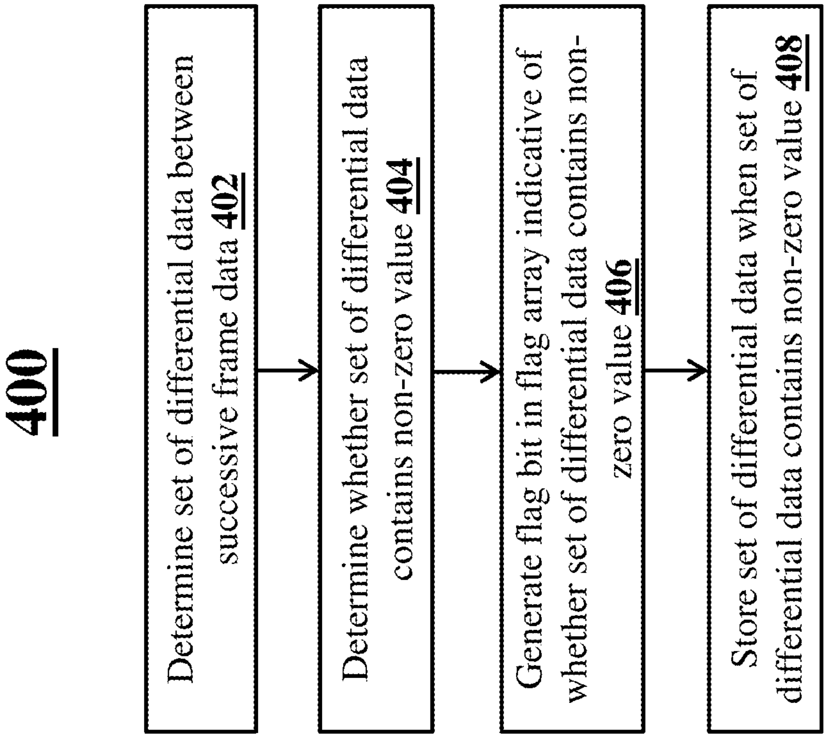
FIG. 4 shows a first illustrative method of tracing and compressing data, according to an embodiment.

FIG. 4 shows execution steps for tracing and compressing data, according to a method 400. The method 400 includes execution steps 402, 404, 406, and 408. However, other embodiments may include additional or alternative execution steps or may omit one or more steps altogether. The other embodiments may perform certain execution steps in a different order; steps may also be performed simultaneously or near-simultaneously with one another. In addition, the method 400 is described as being executed by a controller of an emulation system in this embodiment. However, in some embodiments, steps may be executed by any number of controllers of the emulation system operating in a distributed emulation system environment. In some cases, a controller executing one or more steps may be programmed to execute various other, unrelated features, where such controller does not need to be operating strictly as an emulation controller described herein.

At a first step 402, a controller of an emulation system may determine a set of differential data between successive frame data received from one or more emulation processors. In operation, the emulation processors may emulate an electronic circuit design. The emulation processors may emulate the electronic circuit design based on design inputs that stimulate the DUT. The design inputs may include a plurality of inputs over a plurality of clock cycles. The set of design inputs for each clock cycle may be input to the emulation processors. During emulation, and in response to the set of design inputs for each clock cycle, the emulation processors may generate a large number of continuously varying states, as well as a plurality of design outputs. The states may represent the states of nodes within the circuit design. For example, the states may include the states of the inputs and the outputs of the individual emulation processors. The states may be extracted and outputted by the emulation processors to the controller. The extraction of the state data corresponds to trace data. A non-transitory storage medium may store the trace data.

The controller is in communication with the non-transitory storage medium, and have access to the trace data received from the emulation processors. The controller may then determine a set of differential data between successive frame data associated with frames generated by the emulation processors. The emulation processors may generate a frame following each clock cycle that consists of all the frame data shifted out once from the electronic circuit design. The frame may fill at least two RAM locations, and a frame length is a multiple of two.

The set of differential data between successive frame data associated with the frames may correspond to the set of differential data between successive frame data such as a first frame data and a second frame data. The first frame data is associated with a first frame, which corresponds to a portion of trace data produced during emulation of the electronic circuit design. The trace data is a record of changing states of signal inputs, signal outputs and internal signals of the electronic circuit design being emulated. Similarly, the second frame data is associated with a second frame, which corresponds to a portion of the trace data produced during the emulation of the electronic circuit design.

At a next step 404, the controller may then determine a value for the set of differential data between the successive frame data. For instance, the controller may determine a value for the set of the differential data between the successive frame data such as a first frame data and a second frame data. The controller may then determine whether the value of the set of differential data between the first frame data and the second frame data contains a non-zero value. The value associated with the first frame data and the value associated with the second frame data is going to be same when a large number of states do not change from a first frame to a second frame, and then the value of the set of differential data between the first frame data and the second frame data will be zero. The value associated with the first frame data and the value associated with the second frame data is going to be different from each other when a large number of states change from the first frame to the second frame, and then the value of the set of differential data between the first frame data and the second frame data will be a non-zero value.

At a next step 406, the controller may generate a flag bit indicative of whether the set of differential data contains the non-zero value. The controller is coupled to a flag array, and the controller may store the flag bit into the flag array. The flag array may include a non-transitory machine-readable storage media configured to store flag bits. In some cases, the flag array may be a component of controller. In some cases, the flag array may be communicatively coupled to the controller, such that the flag array is accessible by the controller. The flag array may include a number of ports such as read ports and write ports.

The flag bit may be a header. The header may be added to some or all of the set of differential data that contains the non-zero value to indicate the status and/or other characteristics associated with the frames corresponding to the set of differential data. The flag bits may be of any size or format.

At a next step 408, the controller may store the set of differential data in the non-transitory storage medium when the set of differential data contains the non-zero value. The controller further stores the successive frame data in the non-transitory storage medium when the set of differential data between successive frame data contains the non-zero value.

In some embodiments, the controller may generate a back-pressure signal when the non-transitory medium is full or near-full. Upon receiving the back-pressure signal, the emulation system may stall one or more emulation cycles until the stored data in the non-transitory storage medium is downloaded to a host work station.

Figure 5:
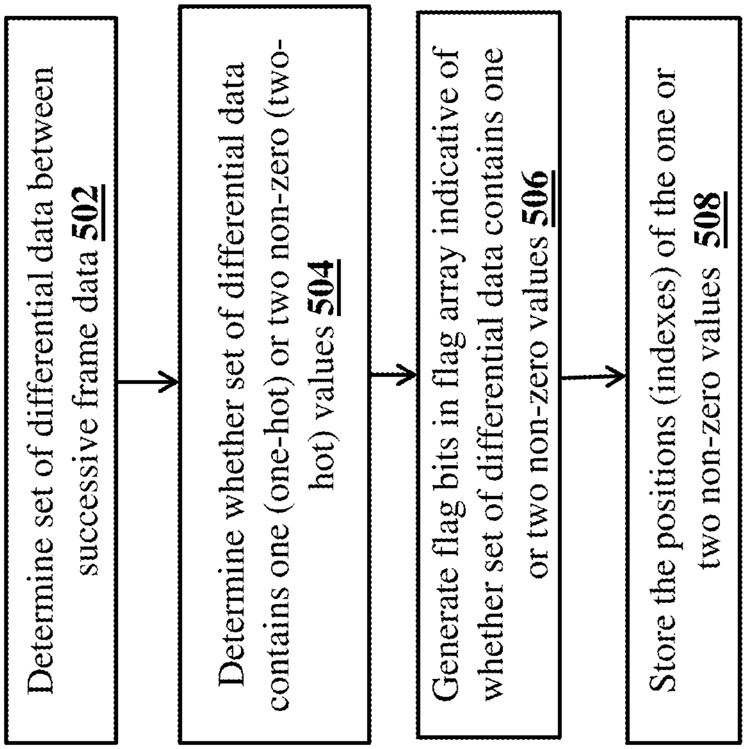
FIG. 5 shows a second illustrative method of tracing and compressing data, according to an embodiment.

FIG. 5 shows execution steps for tracing and compressing data, according to a method 500. The method 500 includes execution steps 502, 504, 506, and 508. However, other embodiments may include additional or alternative execution steps or may omit one or more steps altogether. The other embodiments may perform certain execution steps in a different order; steps may also be performed simultaneously or near-simultaneously with one another. In addition, the method 500 is described as being executed by a controller of an emulation system in this embodiment. However, in some embodiments, steps may be executed by any number of controllers of the emulation system operating in a distributed emulation system environment. In some cases, a controller executing one or more steps may be programmed to execute various other, unrelated features, where such controller does not need to be operating strictly as an emulation controller described herein.

The method 500 may start at step 502, where the controller may determine a set of differential data between successive frame data. One or more emulation processors may generate the successive frame data. On the successive frame data, the controller may perform an XOR operation to generate the differential data. Therefore, the differential data may include bits indicating changes in the corresponding locations in the successive frames. For example, bit 1 in the differential data may indicate that the corresponding bit may have changed between the successive frames and bit 0 may indicate no change. For illustration, this description includes a differential frame data of 16 bits (2 bytes). However, this illustration should not be considered limiting and other sizes of differential frame data and compression operations thereon should be considered within the scope of this disclosure.

At step 504, the controller may determine whether the set of differential data contains one or two non-zero values. If the controller determines that the set of differential data contains one non-zero value, the controller may perform a one-hot compression, as detailed in steps 506 and 508. If the controller determines that the set of differential data contains two non-zero values, the controller may perform two-hot compression, also detailed in step 506 and 508.

At step 506, the controller may generate flag bits in a flag array indicative of whether the set of differential data contains one or two non-zero values. For instance, the controller may generate 2 flag bits for every 16 bit of differential data. For the 16 bit data containing all zeros (indicating that there has been no change between the successive frames), the controller may generate flag bits=00. For the 16 bit data containing one non-zero values, the controller may generate flag bit=01 to indicate one-hot compression. For the 16 bit data containing two non-zero values, the controller may generate flag bit=10 to indicate two hot compression. For a 16 bit data containing more than two non-zero values, the controller may generate flag bit=11 to indicate uncompressed data. The flag array may be in a non-transitory storage medium (e.g., a DDR memory) associated with the trace controller.

At step 508, the controller may store the positions (indexes) of the one or more non-zero values. For a one hot compression, the controller may store a 4 bit index indicating the position of the non-zero value in the 16 bit of differential data. For a two-hot compression, the controller may store a first 4 bit index indicating the position of the most significant non-zero value in the 16 bit differential data and a second 4 bit index indicating the position of the least significant non-zero values in the 16 bit differential data. For the differential data containing more than two non-zero bits, the controller may store the entire differential data. For the differential data containing only zeros, the controller may only store the flag bits in the flag array and may not store the set of differential data. The controller may store the indexes and/or the set of differential data in the non-transitory storage medium.

In some embodiments, the controller may generate a back-pressure signal when the non-transitory medium is full or near-full. Upon receiving the back-pressure signal, the emulation system may stall one or more emulation cycles until the stored data in the non-transitory storage medium is downloaded to a host work station.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A system for compressing emulation frame data, the system comprising:

a non-transitory storage medium including a flag array and configured to store frame data received from one or more emulation processors for a design under test; and a controller device configured to:

determine one or more differences between successive frame data of the frame data stored in the non-transitory storage medium;

based on the one or more determined differences, generate a set of differential data including one or more non-zero bits, the frame data generated during emulation by the emulation processors;

generate a total data stream including a flag and a plurality of index bits, the flag comprising two bits indicating at least one of a one-hot state or a two-hot state, the plurality of index bits comprising one or more bits identifying a bit position of each non-zero bit in the set of differential data, in response to a determination by the controller device that the set of differential data contains the one or more non-zero bits; and compress the set of differential data during the emulation by storing, to the non-transitory storage medium, the plurality of index bits indicating corresponding bit positions of each non-zero bit within the set of differential data, the flag stored into the flag array, in response to the determination, wherein the flag and the plurality of index bits representing only changes in successive frame data are configured for use by a computer executing debugging software for the design under test.

2. The system of claim 1, wherein the controller device is further configured to generate only the flag in response to a determination by the controller device that the set of differential data contains only zero values.

3. The system of claim 1, wherein the set of differential data contains 16 bits.

4. The system of claim 1, wherein the flag contains 2 bits.

5. The system of claim 1, wherein the plurality of index bits comprise a first bit identifying a first bit position of a first non-zero bit in the set of differential data, and a second bit identifying a second bit position of a second non-zero bit in the set of differential data.

6. The system of claim 1, wherein the controller device is further configured to generate a back-pressure signal upon determining that the non-transitory storage medium is full or near full.

7. A system for compressing emulation frame data, the system comprising:

a non-transitory storage medium including a flag array and configured to store frame data received from one or more emulation processors for a design under test; and a controller device configured to:

obtain the frame data from the non-transitory storage medium;

determine one or more differences between successive frame data of the frame data;

based on the one or more determined differences, generate a set of differential data including one or more non-zero bits, the frame data generated during emulation by the emulation processors;

generate a total data stream including a flag and a plurality of index bits, the flag array comprising two bits indicating at least one of a one-hot state or a two-hot state, the plurality of index bits comprising one or more bits identifying a bit position of each non-zero bit in the set of differential data, in response to a determination by the controller device that the set of differential data contains the one or more non-zero bits; and compress the set of differential data during the emulation by storing, to the non-transitory storage medium, the flag into the flag array, and the plurality of index bits indicating corresponding bit positions of each non-zero bit within the set of differential data in response to the determination, wherein the flag and the plurality of index bits representing only changes in successive frame data are configured for use by a computer executing debugging software for the design under test.

8. The system of claim 7, wherein the controller device is further configured to generate only the flag in response to a determination by the controller that the set of differential data contains only zero values.

9. The system of claim 7, wherein the set of differential data contains 16 bits.

10. The system of claim 7, wherein the flag contains 2 bits.

11. The system of claim 7, wherein the plurality of index bits comprise a first bit identifying a first bit position of a first non-zero bit in the set of differential data, and a second bit identifying a second bit position of a second non-zero bit in the set of differential data.

12. The system of claim 7, wherein the controller device is further configured to:

generate, in response to a second determination by the controller device that the set of differential data contains a random value, the total data stream including the flag and a bit sequence, the flag comprising two bits indicating presence of random data, and the bit sequence comprising one or more bits comprising the set of differential data.

13. The system of claim 7, wherein the controller device is further configured to generate a back-pressure signal upon determining that the non-transitory storage medium is full or near full.

14. The system of claim 7, wherein the controller device is further configured to store the set of differential data in response to a determination by the controller device that the set of differential data contains more than two non-zero values.

15. A method for compressing emulation frame data, the method comprising:

receiving, by a controller device from one or more emulation processors, the emulation frame data for a design under test;

determining, by the controller device, one or more differences between successive frame data of the received frame data;

based on the one or more determined differences, generating, by the controller device, a set of differential data between successive frame data of the received emulation frame data;

generating, by the controller device, a total data stream including a flag and a one or more index bits, the flag comprising two bits indicating at least one of a one-hot state or a two-hot state, the one or more index bits comprising one or more bits identifying a bit position of each non-zero bit in the set of differential data, in response to a determination by the controller device that the set of differential data contains the one or more non-zero bits; and compress, by the controller, the set of differential data during the emulation by storing, to a non-transitory storage medium, the one or more index bits indicating the bit position of each non-zero bit within the set of differential data, the flag stored into the flag array, in response to the determination, wherein the one or more index bits representing only changes in successive frame data is configured for use by a computer executing debugging software for the design under test.

16. The method of claim 15, further comprising:

generating, by the controller, only the flag in response to a determination by the controller device that the set of differential data contains only zero values.

17. The method of claim 15, wherein the set of differential data contains 16 bits.

18. The method of claim 15, wherein the flag contains 2 bits.

19. The method of claim 15, wherein the one or more index bits comprise a first bit identifying a first bit position of a first non-zero bit in the set of differential data, and a second bit identifying a second bit position of a second non-zero bit in the set of differential data.

20. The method of claim 15, further comprising:

generating, by the controller device, a back-pressure signal upon determining that the non-transitory storage medium is full or near full.

* * * * *